US008834088B2

(12) United States Patent
Scollay

(10) Patent No.: US 8,834,088 B2
(45) Date of Patent: Sep. 16, 2014

(54) ELEVATOR LINEAR MOTOR DRIVE

(75) Inventor: Stuart Scollay, Sunnyvale, CA (US)

(73) Assignee: Intevac, Inc., Santa Clara, CA (US)

( * ) Notice: Subject to any disclaimer, the term of this patent is extended or adjusted under 35 U.S.C. 154(b) by 1972 days.

(21) Appl. No.: 11/938,728

(22) Filed: Nov. 12, 2007

(65) Prior Publication Data

US 2009/0123256 A1  May 14, 2009

(51) Int. Cl.
*H01L 21/677* (2006.01)
*G11B 5/84* (2006.01)
*H01L 21/673* (2006.01)

(52) U.S. Cl.
CPC ........ *H01L 21/67742* (2013.01); *G11B 5/8404* (2013.01); *H01L 21/67346* (2013.01); *H01L 21/67709* (2013.01); *H01L 21/67748* (2013.01); *H01L 21/67751* (2013.01); *Y10S 414/139* (2013.01)
USPC .. 414/217; 414/939; 204/298.15; 204/298.25

(58) Field of Classification Search
USPC ................ 414/217, 416.07, 939; 204/298.15, 204/298.25
See application file for complete search history.

(56) References Cited

U.S. PATENT DOCUMENTS

| 5,658,114 | A  | * | 8/1997  | Mahler ............................ 414/217 |
| 6,251,232 | B1 | * | 6/2001  | Aruga et al. ............. 204/192.32 |
| 6,919,001 | B2 | * | 7/2005  | Fairbairn et al. ......... 204/298.25 |
| 2003/0184724 | A1 | * | 10/2003 | Ono et al. ......................... 355/72 |
| 2004/0027899 | A1 | * | 2/2004  | Cowburn ....................... 365/222 |
| 2004/0233412 | A1 | * | 11/2004 | Ono et al. ......................... 355/72 |
| 2006/0054495 | A1 |   | 3/2006  | Rohrmann et al. |
| 2006/0099054 | A1 | * | 5/2006  | Friedman et al. ............. 414/217 |
| 2007/0069666 | A1 | * | 3/2007  | Van Eijk et al. ............... 318/135 |
| 2007/0201967 | A1 | * | 8/2007  | Bufano et al. ............ 414/222.01 |

FOREIGN PATENT DOCUMENTS

WO    WO 2006/026886 A1    3/2006

OTHER PUBLICATIONS

European Search Report for EP08253674 dated May 18, 2010.

* cited by examiner

*Primary Examiner* — Scott Lowe
(74) *Attorney, Agent, or Firm* — Nixon Peabody LLP; Joseph Bach, Esq.

(57) ABSTRACT

Disclosed is a substrate processing system with a magnetic conduit configuration to improve the movement of a substrate carrier within the system. The configuration specifically provides for safe, secure movement of a carrier between multiple levels of a substrate processing system by using magnetic conduits to redirect magnetic forces created by a linear motor, permitting the linear motor to be positioned outside of the system and in a location that will not interfere with the movement of the carrier.

2 Claims, 5 Drawing Sheets

ELEVATOR LINEAR MOTOR DRIVE

FIELD OF THE INVENTION

This invention relates to a system and method for handling and processing substrates such as magnetic disks, and more specifically to a system and method for improved movement of a substrate carrier in a substrate processing system using magnetic conduits.

BACKGROUND OF THE INVENTION

Substrate processing, such as the formation of magnetic disks, is a complex and complicated process. Large, customized equipment is required to carry out the numerous unique steps of coating a substrate with multiple layers, then heating and cooling the substrate. Machines for processing substrates usually have a large footprint, and require a significant amount of space to operate. Additionally, the machines need to be operated in high-tech clean rooms, which are expensive to build and maintain. Therefore, it is advantageous to reduce the overall footprint of the substrate processing machines.

It is also desired to improve the processing speed at which each substrate unit is fabricated so as to maximize the value of the equipment. Improving the processing speed is somewhat challenging, since many processing steps have a minimum required time that a particular coating must be applied, heated, or cooled in order to properly coat a substrate. Many improvements have therefore focused on the steps in the process that add no value, such as the time required to move a substrate from one step to the next.

To this end, current technology, such as the 200 Lean® system manufactured by Intevac, Inc. of Santa Clara, Calif., has developed numerous solutions to reduce the overall footprint of the machine. The 200 Lean® is described in further detail in U.S. Pat. No. 6,919,001 (hereafter "the '001 patent"), the disclosure of which is incorporated herein in its entirety. One improvement is the stackable configuration of processing chambers, which allows for double the amount of steps to be performed in half the space required previously. To move a substrate from one stack of processing chambers to another, elevators are configured on either side of the system to move the substrate once it reaches the end of one stack of chambers. Numerous other improvements, not relevant to this discussion, are also described in the '001 patent.

International Patent Publication No. WO 2006/026886 A1 (hereafter "the '886 publication") also describes a substrate processing system with two stacks of processing chambers. Much like the 200 Lean® system described in the '001 patent, the '886 publication describes a lift module to transport a substrate from one stack to the next, and the use of magnetic means, i.e., linear motor, for the transport of the substrate carriers.

The movement of the substrate through a substrate processing system, such as those described in the '001 patent and '886 publication, also require the use of a carrier to support the substrate as it moves through the chambers. The carrier must be designed to tightly grip only the outer edges of the substrate, so as not to interfere with the coating processes. As a result, the carrier has a somewhat flimsy hold on the substrate. A slight bump to the carrier from any direction could knock the substrate out of the carrier, requiring the entire machine to be stopped and serviced. It is therefore desirable to minimize any turbulence on the carrier as it passes through the substrate processing system. Notably, acceleration forces in the direction perpendicular to the surface of the substrate must be minimized. However, this concern must be balanced with the need to improve processing speed, since the faster the process moves, the more likely it is for quick movements to knock the substrate off its carrier.

Therefore, what is needed is an improved substrate processing system that minimizes processing time for non-value added activities, prevents turbulence on the carrier and substrate, and simplifies the process of moving the substrate between multiple levels in a stackable system.

SUMMARY OF THE INVENTION

The following summary of the invention is provided in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

Embodiments of the present invention provide for a substrate processing system with a magnetic conduit configuration to improve the movement of a substrate carrier within the system. In one aspect, the configuration of magnetic conduits specifically provides for fast, secure movement of a carrier in an elevator subsystem of the substrate processing system by using magnetic conduits to redirect magnetic forces created by a linear motor, permitting the linear motor to be positioned outside of the system and in a location that will not interfere with the movement of the elevator.

According to aspects of the invention, a system for transporting a substrate in a substrate processing system having at least one chamber is provided, comprising: tracks positioned within the chamber; a substrate carrier mounted onto the tracks for transporting the substrate; a plurality of magnetic elements attached to the carrier; a linear motor; and a plurality of magnetic conduits positioned between the linear motor and the carrier, wherein the magnetic conduit transmits the magnetic force from the linear motor to the carrier to create magnetic coupling to transport the carrier. The linear motor may be positioned outside of the chambers. Each of the magnetic elements may comprise a magnet positioned over a metallic block. The magnetic conduits may be "L" shaped. The magnetic conduits may be "funnel" shaped. The substrate processing system may comprise at least two levels of processing chambers, with a first level stacked on top of a second level. The system may further comprise an elevator chamber capable of transporting the carrier from one level of the processing chamber to another. The system may further comprise an elevator linear motor positioned outside of the elevator chamber, wherein the elevator linear motor aligns with a series of adjacent magnetic conduits in the elevator chamber, such that the magnetic conduits guide the carrier from a processing chamber into the elevator chamber. The series of adjacent magnetic conduits may further be capable of guiding the carrier from the elevator chamber to a processing chamber.

According to other aspects of the invention, an elevator subsystem in a substrate processing system is provided, comprising: an elevator chamber capable of sustaining a vacuum; at least one linear motor positioned outside the elevator chamber, wherein the linear motor generates a magnetic motive force; a movable carrier comprising a plurality of magnetic elements; a vertically-movable elevator base for moving the carrier vertically; and a plurality of pole pieces attached to the elevator base and coupling the magnetic field from the linear motor to the magnetic elements. The elevator subsystem may further comprise a series of adjacent pole pieces configured to decouple the carrier from a linear motor in an adjoining processing chamber and guide the carrier into the elevator chamber. The elevator subsystem may further comprise a series of rails attached to the elevator base to guide the carrier into the elevator chamber. The plurality of pole pieces may be positioned below the underside of the carrier so as to enhance the stability of the carrier by enhancing the gravitational forces on the carrier. The pole pieces may be formed in an "L" shape, such that the linear motor is located on a lateral wall of the elevator chamber while the carrier is coupled to the pole pieces on its underside. The wall of the elevator chamber between the linear motor and the plurality of pole pieces may be a thin metallic material. The wall may be aluminum. The pole pieces may be made of a permeable, soft metal to minimize the magnetic field loss between the linear motor and the pole pieces. The pole pieces may be a 400 series stainless steel or iron. Each of the magnetic elements may comprise a magnet attached to a metallic block.

According to further aspects of the invention, a substrate processing system is provided, comprising: a series of processing chambers; tracks positioned within each of the chambers; a substrate carrier mounted onto the tracks for transporting the substrate among the chambers; a plurality of magnetic elements attached to the carrier; a linear motor; and a plurality of magnetic conduits positioned between the linear motor and the carrier, wherein the magnetic conduit transmits the magnetic force from the linear motor to the carrier to create magnetic coupling to transport the carrier. The series of processing chambers may comprise a first level of adjacent chambers and a second level of adjacent chambers positioned over the first level of adjacent chambers. The substrate processing system may further comprise an elevator chamber capable of transporting the carrier between the first and second levels of the processing chambers. The substrate processing system may further comprise an elevator linear motor positioned outside of the elevator chamber, wherein the elevator linear motor aligns with a series of adjacent magnetic conduits in the elevator chamber, such that the magnetic conduits guide the carrier into and out of the elevator chamber.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION OF THE INVENTION

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Aspects of the present invention provide for the use of magnetic conduits to improve the time required to move a substrate and carrier from one level to another on a stacked, multi-level substrate processing system. Less mechanical parts are required to move the carrier into an elevator subsystem, and only minimal, shear magnetic forces must be broken when moving the carrier from an adjoining processing chamber to an elevator chamber. Additionally, the use of the magnetic conduits, especially configured in adjacent arrangements of pole pieces, can stabilize the movement of the carrier throughout the system, reducing the risk of a substrate being knocked out of a carrier.

Figure 1:
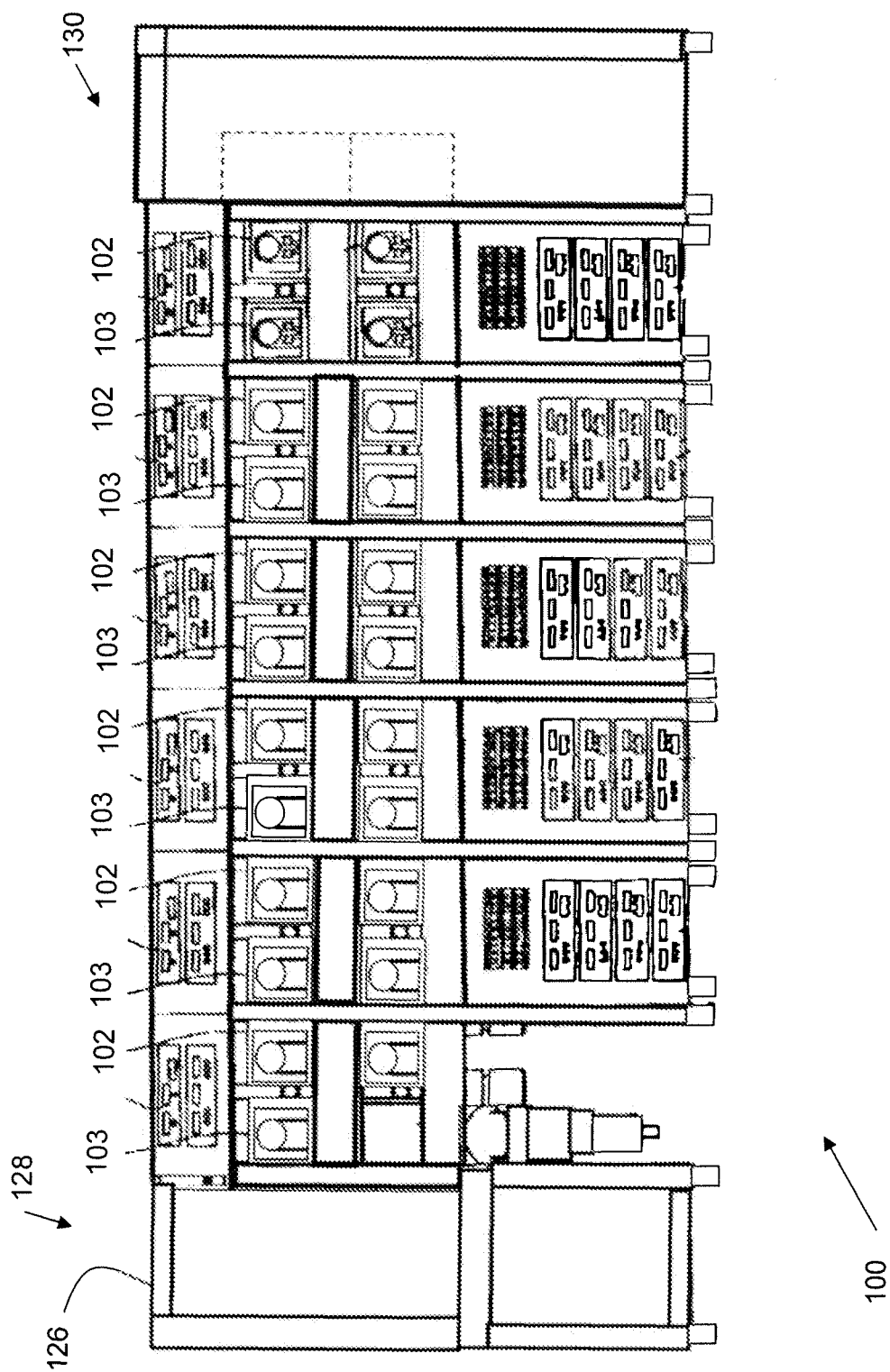
FIG. 1 is an illustration of a substrate processing system according to one embodiment of the invention.
Figure 2:
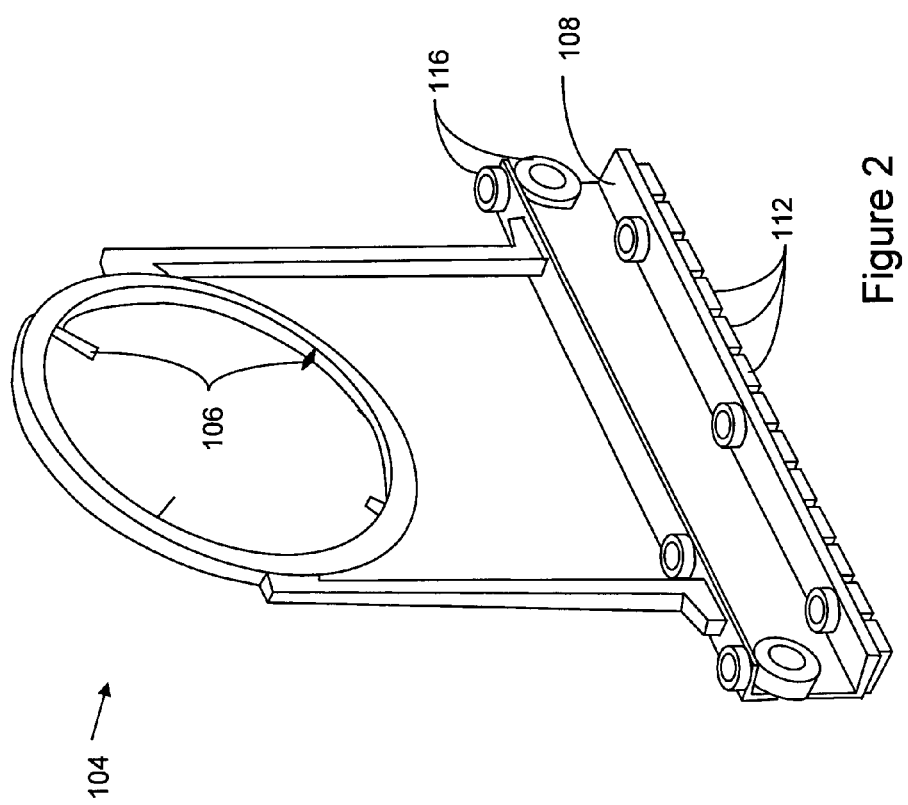
FIG. 2 is a perspective view illustration of a carrier, according to one embodiment of the invention.

In one aspect of the invention, as illustrated in FIG. 1, a substrate processing system 100 comprises a series of processing chambers 102 for applying various coatings or processes to a substrate 103. The substrate enters the system and is mounted to a carrier 104, as shown in FIG. 2, which connects with an outer edge of the substrate at only a few points 106, so as to keep the majority of the substrate surface area exposed for the coatings and other processing. The carrier also has a carrier base 108, which provides a method for the carrier 104 to move through the chambers 102 of the system 100.

As illustrated in FIG. 2, the base 108 of carrier 104 has wheels 116, which engage tracks in the system (shown in other Figures). While it is possible to use magnetic wheels, here the wheels 116 are not magnetized. As described herein, the use or linear motors for the transport system largely eliminates the need for enhanced friction to enable rapid acceleration and deceleration control. The base 108 also incorporates part of a magnetic transport system. Namely, in this embodiment, a magnetic transport mechanism is implemented as a lineal motor used to transport the carrier between chambers and into and out of the elevators. The linear motor may be of a reluctance type. To interact with the linear motor, magnetic material, magnets, or both (112) are positioned on the base 108. In one embodiment, elements 112 are made of magnetic material. In other embodiment elements 112 are individual magnets. In yet other embodiment elements 112 are individual magnets attached to magnetic material.

Figure 3:
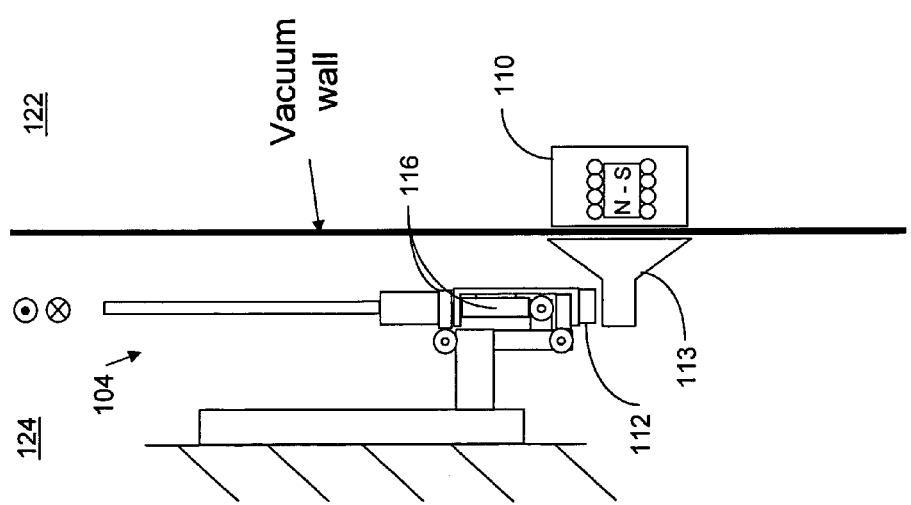
FIG. 3 is a side-view illustration of an embodiment of the magnetic transport mechanism of the invention.

An embodiment of the magnetic transport mechanism is illustrated in FIG. 3. In FIG. 3, a vacuum wall separates the part of the machine that is in vacuum, i.e., 124, from the part of the machine that is in atmosphere, i.e., 122. The linear motor 110 is situated in the atmosphere, while the carrier 104 rides on tracks 114 provided in the vacuum side. Coupling of the magnetic energy to move the carrier is provided by magnetic field conduits 118, which confine and direct the magnetic field from the linear motor 110 towards the magnetic coupling elements 112 at the base of the carrier. Thus, when the linear motor 110 is actuated it moves the coupled carrier base 108 from one processing chamber to another, or into and out of the elevators.

To further provide for stable movement along the linear path of the substrate processing system, in the embodiment illustrated in FIG. 3, the carrier base interacts with a series of rails 114 that run along the length of the processing chambers and elevators. The carrier base is configured with wheels 116 that roll along the rails and keep the carrier moving in a straight line. In FIG. 3 the motion of the carrier 104 is into and out of the page, as indicated by the (x) q indicators.

In one aspect of the invention, magnetic conduits are used to extend and modify where a reacting element of a linear motor (such as the magnet in the carrier base) needs to be in order to maintain the magnetic coupling. In a typical configuration, the linear motor is situated parallel to the reacting element, such as a magnet, iron, or other conducting material. With the use of magnetically soft material, such as 400 series stainless steel or iron, the magnetic forces created in the linear motor can be redirected to alternative angles and locations using the magnetic conduits 118.

Figure 4A:
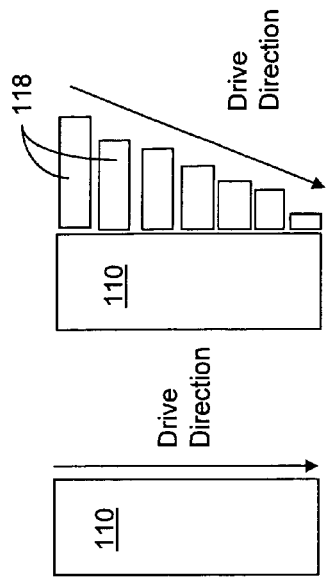
FIG. 4A is an illustration of the ability of a magnetic conduit, or pole piece, to directionally affect the path of a magnetic reactant, in accordance with one embodiment of the present invention.
Figure 4B:
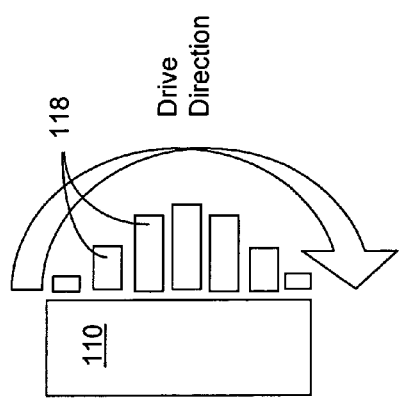
FIG. 4B is a further illustration of the ability of a pole piece to directionally affect the path of a magnetic reactant in a curved manner, in accordance with one embodiment of the present invention.
Figure 4C:
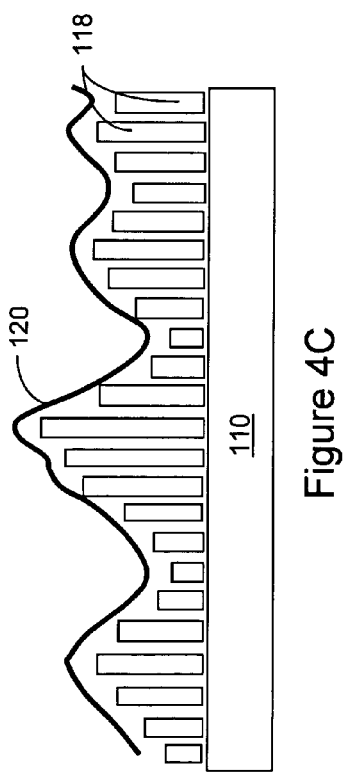
FIG. 4C is an illustration of the ability of a pole piece to directionally affect the path of a magnetic reactant, in accordance with one embodiment of the present invention.

FIGS. 4A-4C illustrate the ability of the magnetic conduits 118 to redirect the magnetic forces from the linear motors 110. In one embodiment, the magnetic conduits can be arranged in a series of pole pieces 118, as illustrated in FIG. 4A. The pole pieces 118 are extended and have various lengths, which cause a magnet moving along a path 120 by the extended pole pieces 118 to move at the same angle as the arranged pole pieces 118. The motor, such as a linear motor 110, can be separated from the pole pieces 118 by a wall (not shown) and still transmit the magnetic force to the pole pieces 118. If the magnet is connected with a carrier, as in the substrate processing system of the present embodiment, the carrier and substrate will take the same path. FIG. 4B illustrates how the pole pieces 118 can be arranged to cause a carrier to travel in a curved path 120, and FIG. 4C illustrates how a customized arrangement of pole pieces 118 can cause the carrier path 120 to move in a variety of directions, while using a linear motor having a linear motion path.

Figure 5:
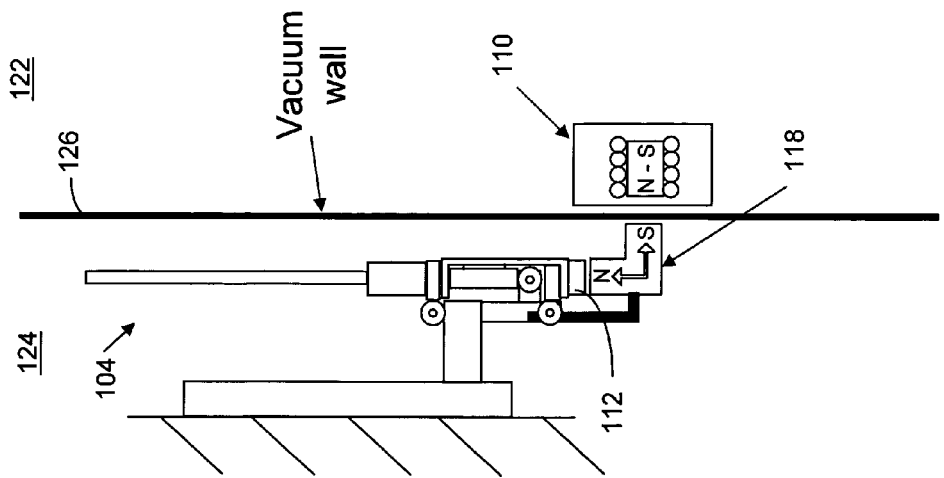
FIG. 5 is an illustration of a carrier base magnetically interacting with a linear motor, according to an embodiment of the present invention.
Figure 6:
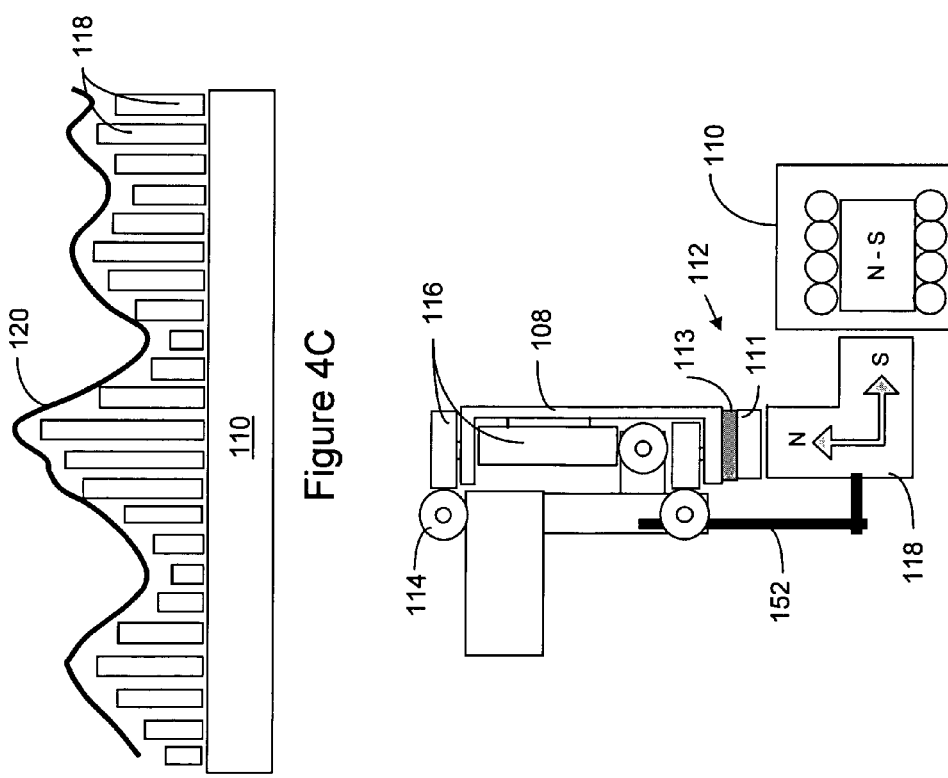
FIG. 6 is a detailed view of the embodiment of FIG. 5.

FIG. 5 illustrates another embodiment wherein the pole pieces 118 are in an "L" shape and are held by mountings 152 to be situated below the carrier base 108 as it travels through the substrate processing system 100. The plurality of pole pieces 118 are positioned below the underside of the carrier so as to enhance the stability of the carrier by enhancing the gravitational forces acting on the carrier. That is, by bending the magnetic fields created by the linear motor so as to attract the magnetic elements at the base of the carrier, the bent magnetic forces enhance the gravitational forces acting on the carrier. The mountings 152 are attached to elements of the chamber, such as chamber wall, elevator, etc. An enlarged view of this embodiment detailing its relevant elements is illustrated in FIG. 6. The pole pieces 118 provide a stabilizing magnetic force coupling to the carrier base 108 and prevent unnecessary turbulence, thereby minimizing the risk of the substrate (not shown) becoming dislodged from the carrier 104. As illustrated in FIG. 6, elements 112 are individual magnets 111 attached to magnetic material blocks 113.

As in the other embodiments, the use of the magnetic couplings also enables the linear motor 110 to be mounted outside of the processing chambers in an atmosphere 122, instead of the vacuum 124, separated by wall 126. With the numerous wires and components of the linear motor 110 outside, a stronger vacuum can be created with less risk of contamination or interference from the linear motor 110.

In an alternate embodiment, the linear motor is configured within the vacuum and forms a direct magnetic coupling with the carrier base. However, the pole pieces could be configured to interact with the linear motor and then form a right angle to guide the magnetic field to properly interact with the carrier. A configuration such as this would prevent undesired lateral movement of the carrier during movement between processing chambers.

One application of the magnetic conduits is in an elevator subsystem of a substrate processing system, such as the elevator subsystem shown in FIG. 1. In one embodiment, the elevator subsystem comprises an elevator chamber 126, which connects with a processing chamber 102 on the end of both a first row 128 and second row 130 of processing chambers. The elevator subsystem is designed to move a carrier and substrate from one row to another for continued processing. By implementing the use of magnetic conduits in the form of an arrangement of corresponding pole pieces in the elevator chamber 126, a carrier can be loaded into and transported within the elevator chamber 126. A separate linear motor is then configured outside the elevator chamber to provide the magnetic force for the pole pieces to move the carrier into the elevator chamber.

Figure 7:
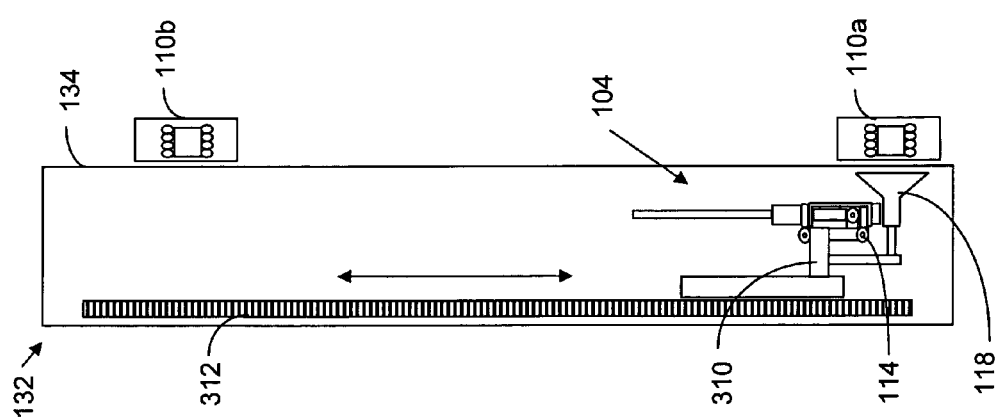
FIG. 7 illustrates an elevator according to one aspect of the present invention.

FIG. 7 illustrates one embodiment of an elevator 132 according to the present invention, where two linear motors 110a and 110b are positioned outside of the elevator chamber wall 134. The elevator base 310 travels up and down on an elevating mechanism, such as an elevator shaft or chain 312. Tracks 114 and pole pieces 118 are attached to the elevator base 310. When the elevator 132 places the elevator base 310 in alignment with process chambers at either the lower position or the upper position, the pole pieces 118 come into alignment with a corresponding linear motor 110a or 110b. In this position, when the linear motor is energized its force field is transmitted to the pole pieces 118 through the wall 134, so as to transport the carrier 104.

Figure 8:
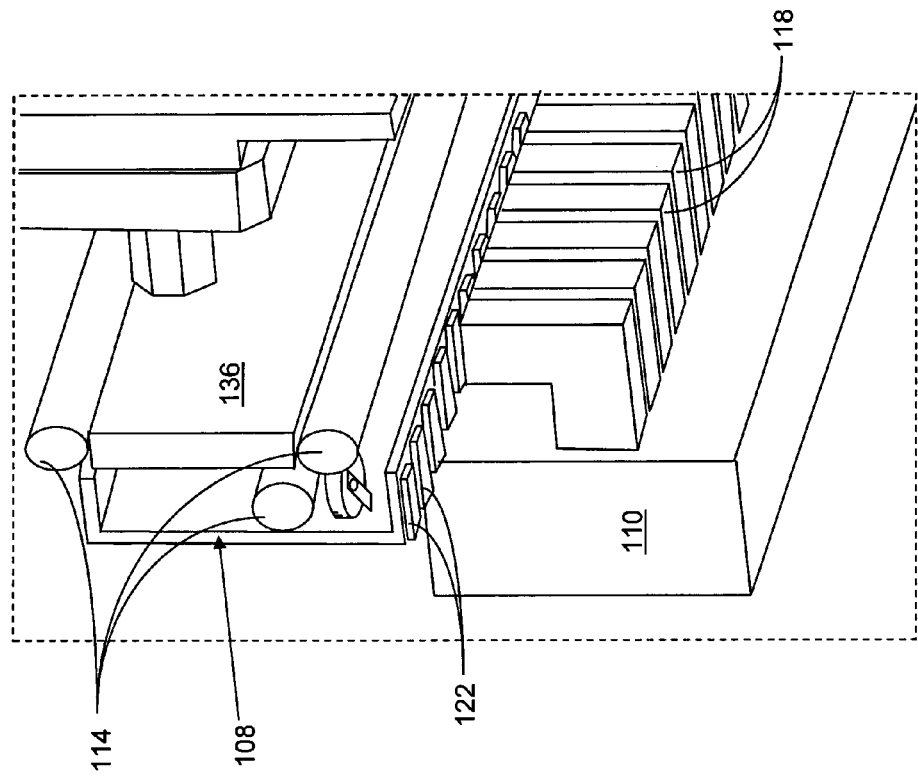
FIG. 8 is an enlarged view of an elevator and linear motor according to one aspect of the present invention.

FIG. 8 illustrates a close-up of relevant elements within an elevator according to an embodiment of the invention, without showing the wall 134, so that the linear motor 110 is visible. In this embodiment the pole pieces 118 bend the field of the linear motor 110 at a 90 degree turn and are therefore "L" shaped. The pole pieces 118 are positioned underneath the carrier base 108, so that the magnetic force being transmitted from the linear motor 110 is transmitted up through the pole piece 118 to form a magnetic coupling with a magnet or magnetic material 112 mounted in the carrier base 108. FIG. 8 further illustrates the specific design of the pole pieces 118 and their interaction with the magnets 112 in the carrier base 108. The pole pieces 118 are mounted onto a rail mount 136, which is connected with the back plate 138 of the elevator 134 within the elevator chamber. The rails 114 are positioned on the rail mount 136, and provide a horizontal guide for the carrier base 108 as it enters the elevator chamber. The carrier base will therefore enter the elevator chamber from a plane extending from behind the page, to provide a point of reference.

Once the carrier has entered the elevator chamber, the elevator will raise or lower the back plate 138, depending on the needed movement, and the carrier base 108, now secured onto the rails 114, moves as well. Once the elevator has reached the desired level, the elevator stops, and the linear motor is activated so that the pole pieces 118 bend the magnetic field to move the carrier base 108 out of the elevator chamber and into the adjacent processing chamber at the new level.

The extended pole design allows the linear motors to be stationary in a location outside the elevator. The pole pieces extend the magnetic fields to properly interact with the magnetic material attached to the carrier. When in the elevator, when the back plate 138 is raised or lowered, the pole pieces 118 are moved away from the linear motor 110, and consequently no other forces are necessary to oppose the magnetic field exerted by the linear motor. The simple mechanical motion of the pole pieces disengages the carrier from the magnetic forces of the linear motor. This arrangement eliminated the need for an opposing magnetic force as disclosed in the '886 publication cited above.

In one aspect of the invention, very permeable magnetic pole pieces are placed close to existing poles in the linear motor, so as to minimize magnetic field losses. The pole pieces should be designed to maximize efficiency (i.e. laminated pole pieces to limit eddy current losses).

In another embodiment, the pole pieces are used in reverse as sensors that detect magnetic fields. An Analog Hall Effect Sensor can be placed at one of the extended pole piece to read the magnetic field on the other side of the pole piece, although some loss in strength will result.

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention. Embodiments within the scope of the present invention also include computer readable media for carrying or having computer-executable instructions or data structures stored thereon. Such computer-readable media may be any available media that can be accessed by a general purpose or special purpose computer. By way of example, and not limitation, such computer-readable media can comprise RAM, ROM, EEPROM, DVD, CD ROM or other optical disk storage, magnetic disk storage or other magnetic storage devices, or any other medium which can be used to carry or store desired program code means in the form of computer-executable instructions or data structures and which can be accessed by a general purpose or special purpose computer. A focused ion beam tool, electron beam tool, and other various integrated circuit processing tools set forth herein may be viewed as special purpose computers. When information is transferred or provided over a network or another communications link or connection (either hardwired, wireless, or a combination of hardwired or wireless) to a computer, the computer properly views the connection as a computer-readable medium. Thus, any such a connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

All directional references (e.g., upper, lower, upward, downward, left, right, leftward, rightward, top, bottom, above, below, etc. are only used for identification purposes to aid the reader's understanding of the embodiments of the present invention, and do not create limitations, particularly as to the position, orientation, or use of the invention unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. It is intended that all matter contained in the above description or shown in the accompanying drawings shall be interpreted as illustrative only and not limiting. Changes in detail or structure may be made without departing from the spirit of the invention as defined in the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention.

The figures shown herein are not necessarily drawn to scale, with some components and features being exaggerated for clarity.

What is claimed is:

1. An elevator subsystem in a substrate processing system, comprising:
   an elevator chamber capable of sustaining a vacuum;
   at least one linear motor positioned outside the elevator chamber, wherein the linear motor generates a magnetic motive force;
   a movable carrier comprising a plurality of magnetic elements;

a vertically-movable elevator base for moving the carrier vertically; and, a plurality of pole pieces attached to the elevator base and coupling the magnetic field from the linear motor to the magnetic elements;

wherein the plurality of pole pieces are positioned below the underside of the carrier so as to enhance the stability of the carrier by enhancing the gravitational forces on the carrier.

2. The elevator subsystem of claim 1, wherein the pole pieces are formed in an "L" shape, such that the linear motor is located on a lateral wall of the elevator chamber while the carrier is coupled to the pole pieces on its underside.

* * * * *